United States Patent
Kim et al.

(10) Patent No.: US 12,543,516 B2
(45) Date of Patent: Feb. 3, 2026

(54) METHODS OF FORMING SILICON GERMANIUM STRUCTURES

(71) Applicant: ASM IP Holding, B.V., Almere (NL)

(72) Inventors: Wonjong Kim, Leuven (BE); Rami Khazaka, Leuven (BE); Michael Eugene Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 138 days.

(21) Appl. No.: 18/161,681

(22) Filed: Jan. 30, 2023

(65) Prior Publication Data

US 2023/0245888 A1    Aug. 3, 2023

Related U.S. Application Data

(60) Provisional application No. 63/305,926, filed on Feb. 2, 2022.

(51) Int. Cl.
*H01L 21/02* (2006.01)

(52) U.S. Cl.
CPC .... *H01L 21/0262* (2013.01); *H01L 21/02381* (2013.01); *H01L 21/0245* (2013.01); *H01L 21/02532* (2013.01); *H01L 21/02587* (2013.01); *H01L 21/02661* (2013.01)

(58) Field of Classification Search
CPC ........... H01L 21/0262; H01L 21/02381; H01L 21/0245; H01L 21/02532; H01L 21/02587; H01L 21/02661
See application file for complete search history.

(56) References Cited

U.S. PATENT DOCUMENTS

| | | | |
|---|---|---|---|
| 2005/0051795 A1* | 3/2005 | Arena | H01L 21/02494 257/E21.103 |
| 2005/0092235 A1* | 5/2005 | Brabant | H01L 21/02576 117/101 |
| 2013/0026451 A1* | 1/2013 | Bangsaruntip | B82Y 10/00 257/E29.245 |
| 2019/0181140 A1* | 6/2019 | Rodder | H01L 29/0847 |
| 2019/0280102 A1* | 9/2019 | Zhang | H01L 21/02532 |
| 2019/0326395 A1* | 10/2019 | Ando | H01L 29/66772 |
| 2021/0020429 A1 | 1/2021 | Khazaka et al. | |

(Continued)

OTHER PUBLICATIONS

Hartmann, J. M., et al., "Growth kinetics of Si and SiGe on Si(1 0 0), Si(1 10) and Si(1 1 1) surfaces", Journal of Crystal Growth, vol. 294, pp. 288-295 (Year: 2006).*

(Continued)

*Primary Examiner* — Fernando L Toledo
*Assistant Examiner* — Ryan T. Fortin
(74) *Attorney, Agent, or Firm* — Banner & Witcoff, Ltd.

(57) ABSTRACT

Methods for forming structures that include forming a heteroepitaxial layer on a substrate are disclosed. The presently disclosed methods comprise epitaxially forming a buffer layer on the substrate. The substrate has a substrate composition. The buffer layer has a buffer layer composition. The buffer layer composition is substantially identical to the substrate composition. The presently disclosed methods further comprise epitaxially forming a heteroepitaxial layer on the buffer layer. The heteroepitaxial layer has a heteroepitaxial layer composition which is different from the substrate composition.

15 Claims, 5 Drawing Sheets

(56) References Cited

U.S. PATENT DOCUMENTS

2021/0226006 A1* 7/2021 Kuhn ............... H01L 29/66742

OTHER PUBLICATIONS https://web.archive.org/web/20211026140758/https://www.asm.com/solutions/products/epitaxy-products/epsilon-epitaxy, retrieved Oct. 26, 2021, "ASM Epsilon(R) Epitaxy" (Year: 2021).*
Hikavyy, A., et al., "Growth of high Ge content SiGe on (110) oriented Si wafers", Thin Solid Films vol. 520(8), pp. 3179-3184 (Year: 2012).*
Sheng, S.R., et al., "Growth and characterization of Si/SiGe strained-layer superlattices on bulk single-crystal SiGe and Si substrates", Journal of Crystal Growth 253, pp. 77-84 (Year: 2003).*
Bernard, Emilie, et al. "Multi-Channel field-Effect Transistor (MCFET)—Part I: Electrical Performance and Current Gain Analysis." IEEE Transactions on Electron Devices 56.6 (2009): 1243-1251.
Lee, Sung-Young, et al. "A Novel Multibridge-Channel MOSFET (MBCFET): Fabrication Technologies and Characteristics." IEEE Transactions on Nanotechnology 2.4 (2003): 253-257.
Qin, Shu, et al. "Carrier mobility enhancement versus channel direction in highly-doped Si." Surface & Coatings Technology 229 (2013): 80-83.

* cited by examiner

METHODS OF FORMING SILICON GERMANIUM STRUCTURES

FIELD OF DISCLOSURE

The present disclosure generally relates to methods for forming silicon-silicon germanium stacks and to related structures. Such structures are useful in the field of integrated circuits, for example in the context of gate-all-around or nanosheet field effect transistors.

BACKGROUND OF THE DISCLOSURE

Among three-dimensional transistors, Nanosheet field-effect transistor (FET) s are considered as promising next-generation devices due to reduced leakage current and high driving current. The nanosheet-FET's channel is formed by first depositing one or more sequential SiGe and Si layer pairs, and by subsequently removing the SiGe layers to form one or more Si nanosheets. Chemical abruptness of the interfaces is of critical importance for device applications in terms of uniform device performance. A diffuse interface can bring channel surface roughening which can cause carrier scattering and variations in channel thickness.

Obtaining interfaces with good chemical abruptness has been previously successfully obtained on Si(001) substrates but it remains challenging on Si(110) substrates. Indeed, SiGe/Si multi-stacks on Si(110) substrates tend to suffer from faster relaxation and more diffuse SiGe—Si interfaces compared to SiGe/Si multi-stacks on Si(100) substrates.

SUMMARY OF THE DISCLOSURE

Described herein is a method of forming an epitaxial structure. The method comprises providing a substrate to a reaction chamber. The substrate comprises a monocrystalline (110) silicon surface. The method further comprises exposing the substrate to a first silicon precursor. Thus, a monocrystalline silicon buffer layer is epitaxially formed on the (110) silicon surface. The method then comprises executing one or more deposition cycles. A deposition cycle comprises, in the order as given: a SiGe pulse and a Si pulse. A SiGe pulse comprises exposing the substrate to a second silicon precursor and to a germanium precursor. A Si pulse comprises exposing the substrate to a third silicon precursor. Thus, one or more bilayers are formed overlying the monocrystalline silicon buffer layer. A bilayer comprises a SiGe layer and a Si layer.

In some embodiments, the step of exposing the substrate to a first silicon precursor and the step of executing the one or more deposition cycles are executed in the same reaction chamber without any intervening vacuum break.

In some embodiments, the reaction chamber is maintained at a pressure of at least 5 Torr to at most 80 Torr.

In some embodiments, at least one of the first silicon precursor, the second silicon precursor, the third silicon precursor, and the germanium precursor are provided to the reaction chamber in a carrier gas stream.

In some embodiments, the first silicon precursor, the second silicon precursor, and the third silicon precursor are independently selected from silanes and halosilanes.

In some embodiments, the first silicon precursor comprises a halosilane.

In some embodiments, the step of exposing the substrate to the first silicon precursor is preceded by a step of cleaning the substrate.

In some embodiments, the step of cleaning the substrate comprises one or more of exposing the substrate to hydrogen gas, and exposing the substrate to fluorine radicals.

In some embodiments, the first silicon precursor, the second silicon precursor, and the third silicon precursor are the same.

In some embodiments, the first silicon precursor and the second silicon precursor are the same, and the first silicon precursor is different from the third silicon precursor.

In some embodiments, the first silicon precursor and the third silicon precursor are the same, and the first silicon precursor is different from the second silicon precursor.

In some embodiments, the first silicon precursor, the second silicon precursor, and the third silicon precursor are different.

In some embodiments, the reaction chamber is maintained at a pressure of at least 5 Torr to at most 760 Torr.

In some embodiments, the germanium precursor comprises a germane.

Further described herein is a method of forming a heteroepitaxial layer on a substrate. The method comprises, in the order given: providing a substrate to the reaction chamber, epitaxially forming a buffer layer on the substrate, and epitaxially forming a heteroepitaxial layer on the buffer layer. The substrate has a substrate composition and the buffer layer has a buffer layer composition. The buffer layer composition is substantially identical to the substrate composition. The heteroepitaxial layer has a heteroepitaxial composition that is different from the substrate composition.

In some embodiments, the substrate is a monocrystalline Si(110) substrate, and the substrate and the buffer layer comprise more than 99 atomic percent silicon.

In some embodiments, the heteroepitaxial layer comprises an alloy of silicon and germanium.

In some embodiments, the substrate is maintained at a temperature of at most 700° C.

Further described herein is a structure formed according to a method as described herein.

Further described herein is a system comprising one or more reaction chambers, a gas injection system, and a controller configured for causing the system to perform a method as described herein.

BRIEF DESCRIPTION OF THE DRAWING FIGURES

The present disclosure and its embodiments are illustrated by means of the following figures.

Figure 1:
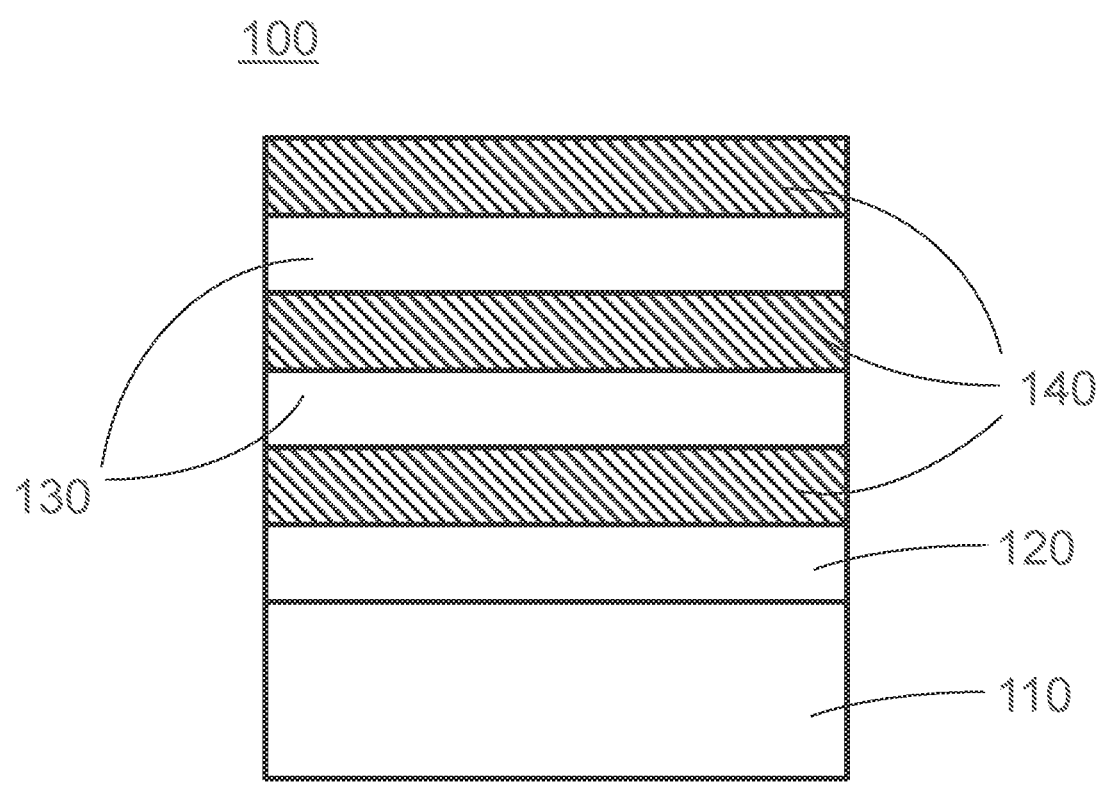
FIG. 1 illustrates a structure that can be formed in accordance with a method as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to heteroepitaxy. In particular, the presently disclosed methods feature growing a buffer layer on a substrate before proceeding with growing a heteroepitaxial layer. The buffer layer has a composition which is substantially equal to the composition of the substrate.

In this disclosure, "gas" can refer to material that is a gas at room temperature and pressure, a vaporized solid and/or a vaporized liquid, and may be constituted by a single gas or a mixture of gases, depending on the context. A gas other than the process gas, i.e., a gas introduced without passing through a gas distribution assembly, other gas distribution device, or the like, may be used for, e.g., sealing the reaction space, which includes a seal gas, such as a noble gas. In some embodiments, the terms "precursor" and "reactant" can be used interchangeably and can each refer generally to a gas-phase compound that participates in the chemical reaction that produces, for example, a film or layer.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or the like, and can include one or more layers overlying or underlying the bulk material. Further, the substrate can include various topologies, such as recesses, lines, and the like formed within or on at least a portion of a layer of the substrate.

As used herein, the term "epitaxial layer" can refer to a substantially single crystalline layer overlying a substantially single crystalline layer or substrate.

As used herein, the term "layer comprising silicon germanium" or "SiGe layer" refers to a layer that includes silicon and germanium, such as an alloy of silicon and germanium. Layers comprising silicon germanium can be represented by the general formula of $Si_{1-x}Ge_x$, where x is greater than zero and less than one. In some contexts, a layer comprising SiGe can include bulk material of SiGe. Layers comprising silicon germanium can include other elements, such as one or more of B, As, Ga, P, Sn, In, or the like. For example, layers comprising silicon germanium can include about zero or up to about 1.0 atomic percent of one or more of such other elements.

As used herein, the term "layer comprising silicon" or "Si layer" can refer to a layer that includes silicon, such as a monocrystalline silicon layer. Layers comprising silicon can include other elements, such as dopants, including, for example, C, P, As, B, Sb or the like—e.g., up to about 0.01 to about 95 atomic percent of one or more of the other elements.

As used herein, the term "structure" can refer to a partially or completely fabricated device structure. By way of examples, a structure can include a substrate with a transition layer and/or passivation formed thereon. Structures can include additional layers, such as layers comprising SiGe and/or layers comprising Si.

The term "carrier gas" as used herein may refer to a gas that is provided to a reaction chamber together with one or more precursors. For example, a carrier gas may be provided to the reaction chamber together with one or more of the precursors used herein. Exemplary carrier gasses include $H_2$, $N_2$, and noble gasses such as He, Ne, Kr, Ar, and Xe.

It shall be understood that terms such as Si(100), Si(110), and the like refer to crystal orientations as denoted by Miller indices. Accordingly, a Si(100) substrate refers to a substrate comprising a surface area that is oriented along a (100) direction. Similarly, a Si(110) substrate refers to a substrate comprising a surface area that is oriented along a (110) direction. In some embodiment, the terms Si(100) substrate and Si(110) substrate refer silicon wafers which are cut along a (100) plane or a (110) plane, respectively. It shall be understood that the orientation of the respective substrate or surface area does not have to be perfect and can, for example, be off by a few degrees, e.g. by at least 0.1 degrees to at most 2.0 degrees. Advantageously, the substrate is a monocrystalline substrate.

Described herein is a method of forming a heteroepitaxial layer on a substrate. The method comprises a step of providing a substrate to a reaction chamber. Then, a buffer layer is epitaxially formed on the substrate. The buffer layer has a composition which is substantially equal to the composition of the substrate. Then, a heteroepitaxial layer is formed on the buffer layer. The heteroepitaxial layer has a composition which is different from the composition of the substrate. Advantageously, the buffer layer can improve the epitaxial quality of the heteroepitaxial layer.

It shall be understood that the composition of the buffer layer is equal, or substantially equal, to the composition of the substrate. This notwithstanding, and in some embodiments, the buffer layer can comprise impurities, for example impurities in a concentration which is less than 0.1 atomic percent, or less than $1.0\times10^{-2}$ atomic percent, or less than $1.0\times10^{-3}$ atomic percent, or less than $1.0\times10^{-4}$ atomic percent, or less than $1.0\times10^{-5}$ atomic percent, or less than $1.0\times10^{-6}$ atomic percent, or less than $1.0\times10^{-2}$ atomic percent, or less than $1.0\times10^{-8}$ atomic percent, or less than $1.0\times10^{-9}$ atomic percent, or less than $1.0\times10^{-10}$ atomic percent.

In some embodiments, the heteroepitaxial layer can comprise a plurality of sub-layers. For example, the plurality of sub-layers can comprise a plurality of heteroepitaxial layer pairs. A heteroepitaxial layer pair comprises a first sub-layer and a second sub-layer. At least one of the first sub-layer and the second sub-layer has a composition which is different from the composition of the substrate. In some embodiments, the substrate comprises silicon, the buffer layer comprises silicon, the first sub-layer comprises a silicon-germanium alloy comprising at least 10 atomic percent of germanium, and the second sub-layer comprises silicon. The substrate can, for example, be a monocrystalline Si(100) or Si(110) wafer. For example, the substrate can be grown using a Czochralski or float zone process. In some embodiments, the substrate is a monocrystalline Si(110) substrate, and the substrate and the buffer layer comprise more than 99 atomic percent silicon, and the heteroepitaxial layer comprises an alloy of silicon and germanium.

Thus, further described herein is a specific method of forming an epitaxial structure. The method comprises providing a substrate to a reaction chamber. The substrate comprises a monocrystalline (110) silicon surface, also known as a Si(110) surface. The method further comprises exposing the substrate to a first silicon precursor. Thus, a monocrystalline silicon buffer layer is formed on the (110) silicon substrate. Then, the method comprises executing one or more deposition cycles. A deposition cycle comprises, in the following order, a SiGe pulse and a Si pulse. It shall be understood that "SiGe pulse" stands for silicon-germanium pulse, and that "Si pulse" stands for silicon pulse. The SiGe pulse comprises exposing the substrate to a second silicon precursor and to a germanium precursor. The Si pulse comprises exposing the substrate to a third silicon precursor. Thus, one or more bilayers are epitaxially formed on the monocrystalline silicon buffer layer. A bilayer comprises a SiGe layer and a Si layer. Advantageously, growing the buffer layer before the one or more bilayers can reduce the interface thickness between the Si and SiGe layers compared to the case in which the one or more bilayers are directly formed on the substrate.

In some embodiments, the one or more Si—SiGe bilayers can be grown according to a method as described in US20210020429A1, which is hereby incorporated by reference in its entirety.

In some embodiments, at least one of the Si and the SiGe layers comprised in the one or more bilayers has a thickness of at least 2 nm to at most 20 nm, or of at least 2 nm to at most 5 nm, or of at least 5 nm to at most 10 nm, or of at least 10 nm to at most 20 nm.

In some embodiments, the Si buffer layer has a thickness of at least 1 nm to at most 30 nm, or of at least 1 nm to at most 2 nm, or of at least 2 nm to at most 5 nm, or of at least 5 nm to at most 10 nm, or of at least 10 nm to at most 20 nm, or of at least 20 nm to at most 30 nm.

It shall be understood that a Si layer substantially consists of silicon. For example, a Si layer can comprise at least 99 atomic percent of Si, or at least 99.9 atomic percent of Si, or at least 99.99 atomic percent of Si, or at least 99.999 atomic percent of Si, or at least 99.9999 atomic percent of Si, or at least 99.99999 atomic percent of Si, or at least 99.999999 atomic percent of Si. This notwithstanding, a Si layer can comprise impurities. Exemplary impurities include B, Al, Sn, P, and As.

It shall be understood that a SiGe layer substantially consists of a silicon-germanium alloy. For example, a SiGe layer can have a combined silicon and germanium concentration of at least 99 atomic percent, or of at least 99.9 atomic percent, or of at least 99.99 atomic percent, or of at least 99.999 atomic percent, or of at least 99.9999 atomic percent, or of at least 99.99999 atomic percent, or of at least 99.999999 atomic percent. This notwithstanding, a SiGe layer can comprise impurities. Exemplary impurities include B, Al, Sn, P, and As.

In some embodiments, a Si layer comprises from at least 50 to at most 90 atomic percent Si, or from at least 60 to at most 80 atomic percent Si. In some embodiments, a SiGe layer comprises from at least 10 to at most 50 atomic percent Ge, or from at least 20 to at most 40 atomic percent Ge.

In some embodiments, the first silicon precursor, the second silicon precursor, and the third silicon precursor are independently selected from silanes and halosilanes.

In some embodiments, one or more of the first silicon precursor, the second silicon precursor, and the third silicon precursor comprises a halosilane. In some embodiments, the first silicon precursor comprises a halosilane. In some embodiments, the second silicon precursor comprises a halosilane. In some embodiments, the third silicon precursor comprises a halosilane. Suitable halosilanes include chlorosilanes such as tetrachlorosilane, trichlorosilane, dichlorosilane, and monochlorosilane. Additional suitable halosilanes include chloropentamethyldisilane (CPMS), dichlorotetramethyldisilane (DTMS), hexachlorodisilane (HCDS), pentachlorodisilane (PCDS), and octachlorotrisilane (OCTS).

In some embodiments, the chlorosilane comprises dichlorosilane. Additionally or alternatively, the silane can comprise a borosilane such as tetraborosilane, triborosilane, diborosilane, or monoborosilane. Additionally or alternatively, the halosilane can comprise an iodosilane such as tetraiodosilane, triiodosilane, diiodosilane, or monoiodosilane.

In some embodiments one or more of the first silicon precursor, the second silicon precursor, and the third silicon precursor comprises a silane. In some embodiments, the first silicon precursor comprises a silane. In some embodiments, the second silicon precursor comprises a silane. In some embodiments, the third silicon precursor comprises a silane. Suitable silanes include silane ($SiH_4$), disilane ($Si_2H_6$), trisilane ($Si_3H_8$) and tetrasilane ($Si_4H_{10}$).

In some embodiments, the first silicon precursor, the second silicon precursor, and the third silicon precursor are the same.

In some embodiments, the first silicon precursor and the second silicon precursor are the same, and the first silicon precursor is different from the third silicon precursor.

In some embodiments, the first silicon precursor and the third silicon precursor are the same, and the first silicon precursor is different from the second silicon precursor.

In some embodiments, the first silicon precursor, the second silicon precursor, and the third silicon precursor are different.

In some embodiments, one or more of the first, second, and third silicon precursor comprises a halosilane and a silane. In other words, and in some embodiments, the silicon precursor comprises a halosilane and a silicon hydride. Suitable silanes include monosilane, disilane, and trisilane.

In some embodiments, at least one of the first, second, and third silicon precursor further comprises a boron precursor, in addition to the silicon and/or germanium precursor. In some embodiments, the boron precursor comprises a borane. Suitable boranes include $B_1$ to $B_{10}$ boranes, i.e. boranes containing 1 to 10 boron atoms per molecule, such as $B_2H_6$.

In some embodiments, at least one of the first, second, and third silicon precursor further comprises an aluminum precursor, in addition to the silicon and/or germanium precursor. In some embodiments, the aluminum precursor comprises $Al(CH_3)_3$.

In some embodiments, at least one of the first, second, and third silicon precursor further comprises a tin precursor, in addition to the silicon and/or germanium precursor. In some embodiments, the tin precursor comprises $SnCl_4$.

In some embodiments, at least one of the first, second, and third silicon precursor further comprises a phosphorous precursor, in addition to the silicon and/or germanium precursor. In some embodiments, the phosphorous precursor comprises $PH_3$.

In some embodiments, at least one of the first, second, and third silicon precursor further comprises an arsenic precursor, in addition to the silicon and/or germanium precursor. In some embodiments, the arsenic precursor comprises $AsH_3$.

In some embodiments, the germanium precursor comprises a germane. Suitable germanes include monogermane, digermane, trigermane, and tetragermane.

In some embodiments, the germanium precursor comprises silicon and germanium. Examples of silicon and germanium-containing precursors include germylsilane.

In some embodiments, the germanium precursor comprises a halogermane. Suitable halogermanes include chlorogermanes such as monochlorogermane, dichlorogermane, trichlorogermane. In some embodiments, the halogermane comprises a halogenated higher order germane, such as a chlorinated digermane, trigermane, or tetragermane.

In some embodiments, the step of exposing the substrate to the first silicon precursor is preceded by a step of cleaning the substrate. A step of cleaning the substrate can comprise, for example, one or more of exposing the substrate to hydrogen gas, and exposing the substrate to fluorine radicals. It shall be understood that after performing a substrate clean, the substrate is exposed to the first silicon precursor without any intervening vacuum break. In some embodiments, the substrate clean and the step of exposing the substrate to the first silicon precursor are performed in the same reaction chamber. In some embodiments, the substrate clean and the step of exposing the substrate to the first silicon precursor are performed in different reaction chambers comprised in the same system. In such a system, the reaction chambers are operationally connected such that a substrate can be moved between them without any intervening vacuum break.

A suitable substrate clean includes a gas-phase pre-clean, e.g., a plasma clean that results in an H-terminated silicon surface. Another possible pre-clean uses wet chemistry. For example, the following sequence may be used: surface oxidation in a mixture consisting of $NH_4OH$, $H_2O_2$, and $H_2O$; followed by a rinse; followed by an HF dip; followed by a rinse. A suitable HF dip comprises, for example, a dip in a mixture consisting of from at least 0.1 vol. % to at most 1.5 vol. % HF in water, e.g., distilled or deionized water.

In some embodiments, the step of exposing the substrate to a first silicon precursor and the step of executing the one or more deposition cycles are executed in the same reaction chamber without any intervening vacuum break.

In some embodiments, the substrate is maintained at a temperature of at least 300° C. to at most 1000° C. while forming the buffer layer. In some embodiments, the substrate is maintained at a temperature of at least 300° C. to at most 500° C., or at a temperature of at least 500° C. to at most 750° C., or at a temperature of at least 750° C. to at most 1000° C. while forming the buffer layer.

In some embodiments, and during formation of the buffer layer, the substrate is maintained at a buffer layer temperature which is higher than a heteroepitaxial layer temperature at which the substrate is maintained during formation of the heteroepitaxial layer. In some embodiments, the buffer layer temperature is at least 50° C. to at most 100° C., or at least 100° C. to at most 150° C., or at least 150° C. to at most 300° C., or at least 300° C. to at most 600° C. higher than the heteroepitaxial layer temperature.

In some embodiments, the substrate is maintained at a temperature of at least 300° C. to at most 500° C. while forming the Si—SiGe multistack, i.e. the silicon-silicon germanium superlattice. In some embodiments, the substrate is maintained at a temperature of at least 300° C. to at most 425° C., or at a temperature of at least 425° C. to at most 500° C. while forming Si—SiGe multistack.

In some embodiments, the substrate is cleaned before forming the buffer layer. Cleaning can be done, for example, by exposing the substrate to fluorine radicals, and by subsequently exposing the substrate to a $H_2$-containing ambient at a temperature of at least 800° C. to at most 1000° C.

It shall be understood that the substrate temperatures can be measured by a pyrometer suspended in the reaction chamber and above the substrate.

In some embodiments, reaction chamber is maintained at a pressure of at least 5 Torr to at most 760 Torr, for example at a pressure of at least 5 Torr to at most 80 Torr. In some embodiments, the reaction chamber is maintained at a pressure of at least 5 Torr to at most 160 Torr. In some embodiments, the reaction chamber is maintained at a pressure of at least 10 Torr to at most 160 Torr. In some embodiments, the reaction chamber is maintained at a pressure of at least 5 Torr to at most 740 Torr. In some embodiments, the reaction chamber is maintained at a pressure of at least 5 Torr to at most 160 Torr. In some embodiments, the reaction chamber is maintained at a pressure of at least 40 Torr to at most 160 Torr. In some embodiments, the reaction chamber is maintained at a pressure of at least 10 Torr to at most 200 Torr, or at a pressure of at least 10 Torr to at most 80 Torr, or at a pressure of at least 20 Torr to at most 80 Torr, or at a pressure of at least 80 Torr to at most 180 Torr, or at a pressure of at least 60 Torr to at most 100 Torr, or at a pressure of at least 40 Torr to at most 80 Torr, or at a pressure of at least 80 Torr to at most 115 Torr, or at a pressure of at least 115 Torr to at most 150 Torr. In other words, in some embodiments, the reaction chamber is maintained at any one of the aforementioned pressures during a process as described herein.

In some embodiments, at least one of the first silicon precursor, the second silicon precursor, the third silicon precursor, and the germanium precursor is provided to the reaction chamber in a carrier gas stream. Thus, in some embodiments, the method further comprises introducing a carrier gas into the reaction chamber. This can be particularly useful when, for example, hard to volatilize precursors are used, in which case a carrier gas can help with bringing the precursors to the reaction chamber. For example, a silicon precursor such as a silane or a halosilane may be provided to the reaction chamber aided by a carrier gas. For example, a germanium precursor such as germane may be provided to the reaction chamber aided by a carrier gas. In some embodiments, the carrier gas essentially consists of one or more inert gasses. In some embodiments, the carrier gas is selected from the list consisting of noble gasses and nitrogen. In some embodiments, the carrier gas is selected from the list consisting of $H_2$, $N_2$, He, Ne, Kr, Ar, and Xe. In some embodiments, the carrier gas comprises $H_2$. In some embodiments, the carrier gas is provided to the reaction chamber at a flow rate from at least 1.0 slm to at most 100 slm, or from at least 60 to at most 100 slm, or from at least 30 slm to at most 60 slm, or from at least 2.0 slm to at most 30 slm, or from at least 2.0 slm to at most 50 slm, or from at least 5.0 slm to at most 20.0 slm, or from at least 8.0 slm to at most 12.0 slm. It shall be understood that the carrier gas is not necessarily provided to the reaction chamber at a constant flowrate throughout a method as described herein, and that different process steps can comprise providing a carrier gas at different flow rates.

Further described herein is a structure formed according to a method as described herein. Suitable structures include Si—SiGe superlattices as illustrated in FIG. 1

Further described herein is a system that comprises one or more reaction chambers, a gas injection system, and a controller. The controller is configured for causing the system to perform a method as described herein.

FIG. 1 illustrates a structure (100) that can be formed in accordance with a method as described herein. The structure (100) comprises a monocrystalline substrate (110) and a buffer layer (120) which is epitaxially grown on the substrate (110). The buffer layer (120) has a composition which is substantially identical to the composition of the substrate (110). On top of the buffer layer, a Si—SiGe superlattice is grown that consists of a plurality of SiGe layers (140) and Si layers (130).

Figure 2:
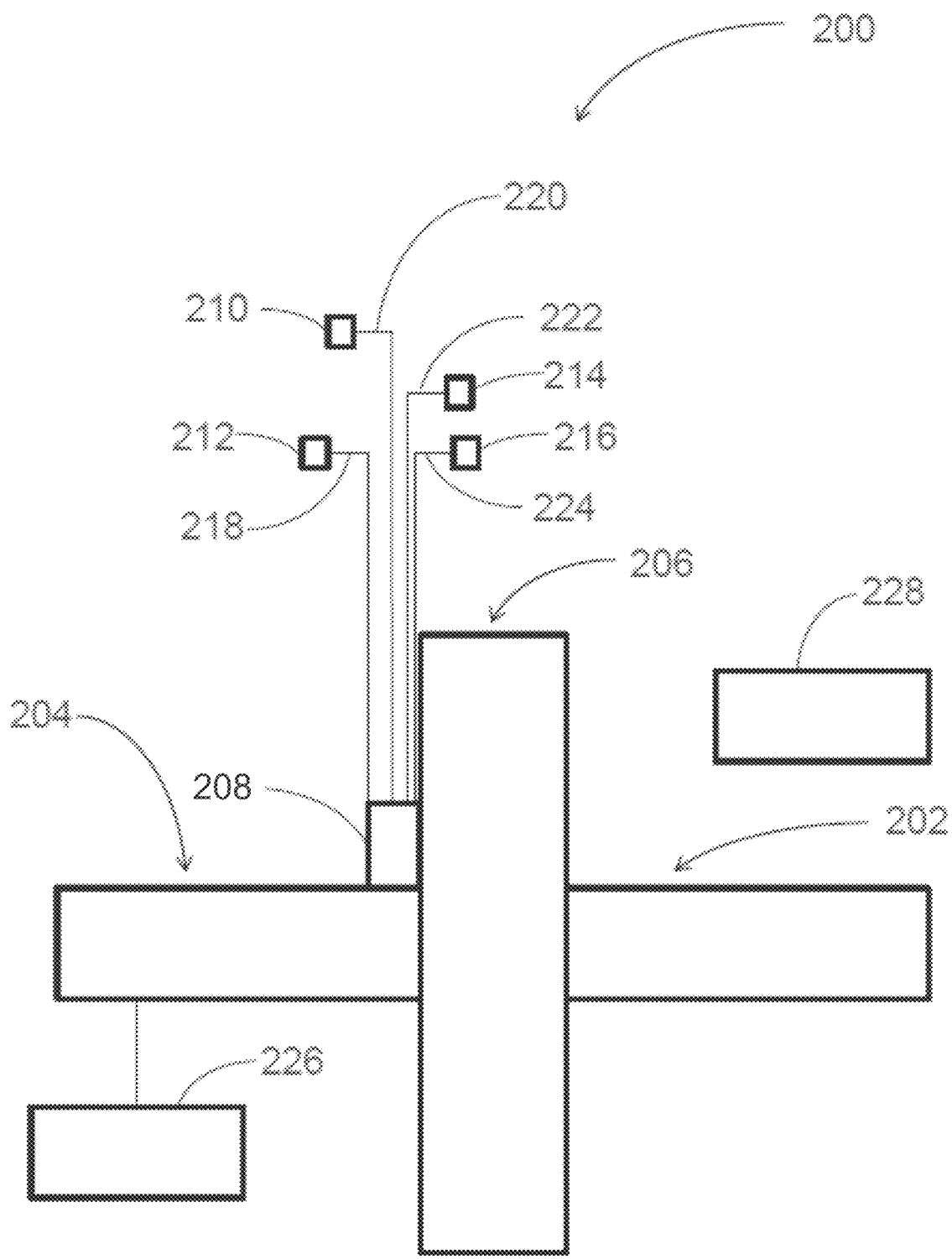
FIG. 2 illustrates a system in accordance with yet additional exemplary embodiments of the disclosure.

FIG. 2 illustrates a system (200) in accordance with yet additional exemplary embodiments of the disclosure. The system (200) can be used to perform a method as described herein and/or form a structure or device portion as described herein.

In the illustrated example, the system (200) includes an optional substrate handling system (202), one or more reaction chambers (204), a gas injection system (206), and optionally a wall (208) disposed between reaction chamber(s) (204) and substrate handling system (202). The system (200) can also include a first gas source (210), a second gas source (212), a third gas source (214), a fourth gas source (216), an exhaust (226), and a controller (228). At least one of the first through fourth gas source includes a silicon precursor source. The silicon precursor may be dichlorosilane. At least one of the first through fourth gas source includes a carrier gas source, for example, a $N_2$ source. At least one of the first through the fourth gas source includes a germanium precursor source. The germanium precursor may be germane. The fourth precursor source (216) can be omitted. If present, the fourth precursor source can, for example, be a tin precursor source, a carbon precursors source, a boron precursor source, an aluminum precursor source, a phosphorous precursor source, or an arsenic precursor source. Thus, at least one of the Si or the SiGe layers can be doped with one or more of tin, carbon, boron, aluminum, phosphorous, and arsenic.

Although illustrated with four gas sources (210-216), the system (200) can include any suitable number of gas sources. The gas sources (210-216) can each include, for example, precursor gasses mentioned herein, including mixtures of such precursors and/or mixtures of one or more precursors with a carrier gas. Additionally, one of the gas sources (210-216) or another gas source can include an etchant, such as an elementary halogen—e.g., chlorine. Gas sources (210)-(216) can be coupled to the reaction chamber (204) via lines (218)-(224), which can each include flow controllers, valves, heaters, and the like.

The system (200) can include any suitable number of reaction chambers (204) and substrate handling systems (202). Further, one or more reaction chambers (204) can be or can include a cross-flow, cold wall epitaxial reaction chamber.

A vacuum source may be included, and the vacuum source can include one or more vacuum pumps.

The controller (228) can be configured to perform various functions and/or steps as described herein. In particular, the controller (228) can be configured for causing the system (200) to perform a method for epitaxially growing a Si—SiGe superlattice as described herein.

A controller (228) can include one or more microprocessors, memory elements, and/or switching elements to perform the various functions. Although illustrated as a single unit, the controller (228) can alternatively comprise multiple devices. By way of examples, the controller (228) can be used to control gas flow (e.g., by monitoring flow rates of precursors and/or other gases from the gas sources (210-216) and/or controlling valves, motors, heaters, and the like). Further, when the system (200) includes two or more reaction chambers, the two or more reaction chambers can be coupled to the same/shared controller.

During operation of reactor system (200), substrates, such as semiconductor wafers (not illustrated), are transferred from, e.g., a substrate handling system (202), to a reaction chamber (204). Once substrate(s) are transferred to the reaction chamber (204), one or more gases from gas sources (210-216), such as precursors, dopants, carrier gases, and/or purge gases, are introduced into the reaction chamber (204) via a gas injection system (206). A gas injection system (206) can be used to meter and control gas flow of one or more gases (e.g., from one or more gas sources (210-216)) during substrate processing and to provide desired flows of such gas(es) to multiple sites within the reaction chamber (204).

Figure 3A:
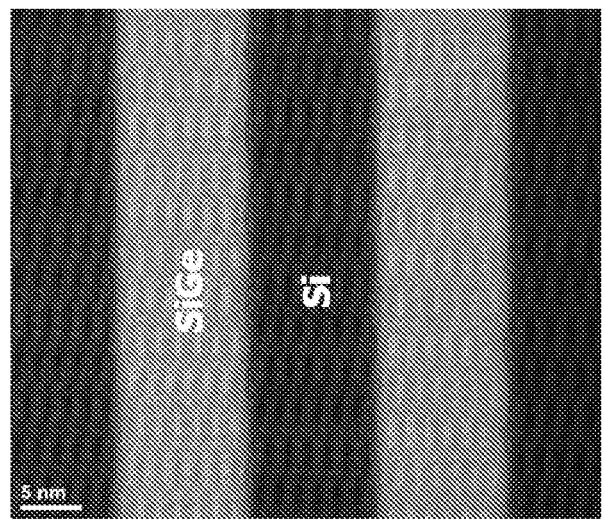
FIGS. 3A and 3B show comparative experimental data.
Figure 3B:
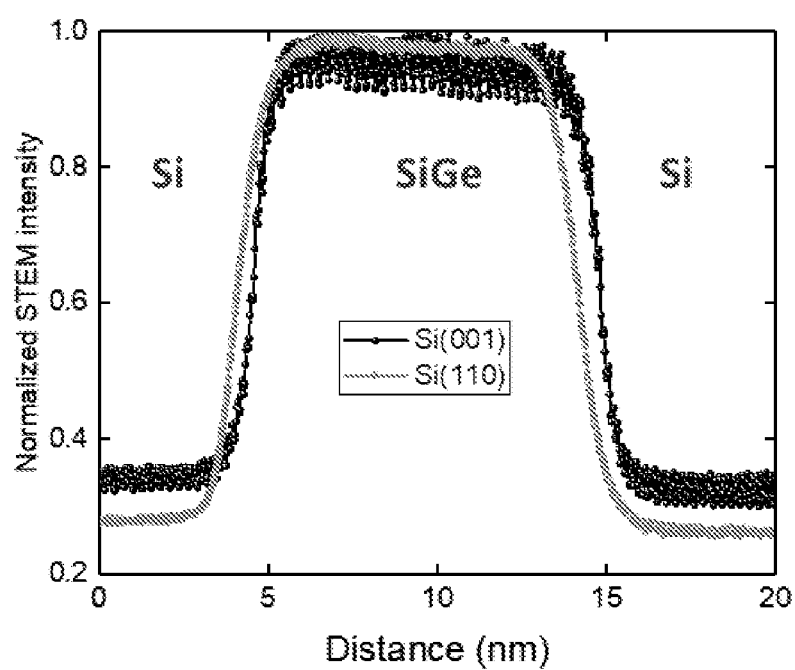

In a comparative example, reference is made to FIGS. 3A and 3B. FIG. 3A shows a transmission electron microscopy (TEM) micrograph of a Si—SiGe superlattice grown on a Si(110) substrate, without buffer layer formed thereon, and FIG. 3B shows normalized TEM intensity data for a Si—SiGe superlattice grown on a Si(100) substrate (black data points), and for a Si—SiGe superlattice grown on a Si(110) substrate (gray data points), both without buffer layer formed thereon. In the present comparative example, the Si and SiGe layers were grown at a temperature of 650° C. and at a pressure of around 40 Torr.

On average, 35 to 40% thicker interfaces, or transitional regions, between the Si and SiGe layers, were observed on Si(110) substrates compared to Si(001) substrates. This is illustrated the table below:

| Interface sharpness (16%-84%) in Å | | |
|---|---|---|
| | Si(001) | Si(110) |
| Si subs--> SiGe | 8.6 | 11.9 |
| SiGe--> Si | 10.3 | 14 |
| Si --> SiGe | 8.7 | 12 |
| SiGe--> Si | 10 | 14 |
| Si --> SiGe | 8.8 | 12.8 |
| SiGe--> Si | 11 | 15.6 |

The interface thicknesses given here are expressed in Angstroms, and correspond to the distance between 16% and 84% intensity in a TEM micrograph as shown in FIG. 3A.

Figure 4A:
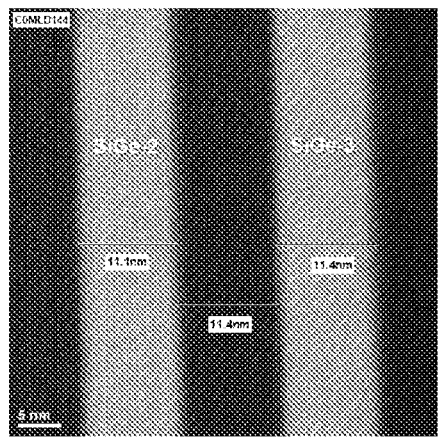
FIGS. 4A and 4B show experimental results obtained using a method as described herein, and a comparison with a reference.
Figure 4B:
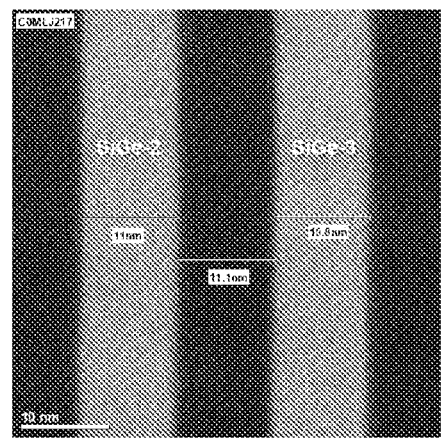

In an exemplary embodiment of the present disclosure, reference is made to FIGS. 4A and 4B, which show two TEM micrographs. In particular, FIG. 4A shows a TEM micrograph of a Si—SiGe superlattice grown on a Si(110) substrate, without buffer layer. The column designated "panel a)" in the table below indicates the corresponding interface thickness in Angstroms and the column designated "sigma a)" in the table below indicates the corresponding standard deviation of the interface thickness. FIG. 4B shows a TEM micrograph of a Si—SiGe superlattice grown on a Si(110) substrate. A Si buffer layer was grown on the substrate according to a method as described herein. The column designated "panel b)" in the table below indicates the corresponding interface thickness in Angstroms and the column designated "sigma b)" in the table below indicates the corresponding standard deviation of the interface thickness. By comparing the a) columns with the b) columns, it becomes clear that epitaxially growing a monocrystalline Si buffer layer on a Si(110) substrate advantageously reduces the thickness of transition regions between Si and SiGe layers in a Si—SiGe superlattice. The thickness of the transition region was reduced for both the Si to SiGe transition, and for the SiGe to Si transition.

| Interface sharpness (16%-84%) in Å | | | | |
|---|---|---|---|---|
| | Panel a) | Sigma a) (Å) | Panel b) | Sigma b) (Å) |
| Si subs--> SiGe | 11.9 | 0.29 | 10.4 | 0.64 |
| SiGe--> Si | 14 | 0.70 | 12 | 0.32 |
| Si --> SiGe | 12 | 0.53 | 10.5 | 0.50 |

-continued

| Interface sharpness (16%-84%) in Å | | | | |
|---|---|---|---|---|
| | Panel a) | Sigma a) (Å) | Panel b) | Sigma b) (Å) |
| SiGe--> Si | 14 | 0.44 | 11.5 | 0.37 |
| Si --> SiGe | 12.8 | 0.52 | 10.3 | 0.26 |
| SiGe--> Si | 15.6 | 0.76 | 12.1 | 0.24 |

For all samples, the substrate was first cleaned by exposure to fluorine radicals and a subsequent bake in a $H_2$-containing ambient at a temperature of at least 800° C. to at most 1000° C. The buffer layer was grown at a substrate temperature of 820° C., a pressure=5 Torr, a $H_2$ carrier gas flow of 30 slm, and a silicon precursor flow of 60 sccm. Dichlorosilane was used as a silicon precursor, and can be provided to the reaction chamber at a flow rate of at least 50 sccm to at most 300 sccm, or of at least 100 sccm to at most 200 sccm. The Si—SiGe superlattice was grown on top of the buffer layer at a temperature of 615° C. and a pressure of 40 Torr. The SiGe layers were grown using dichlorosilane and germane as silicon and germanium precursors, respectively. The Si layers were grown using a mixture of two different silicon precursors: dichlorosilane and silane.

Figure 5:
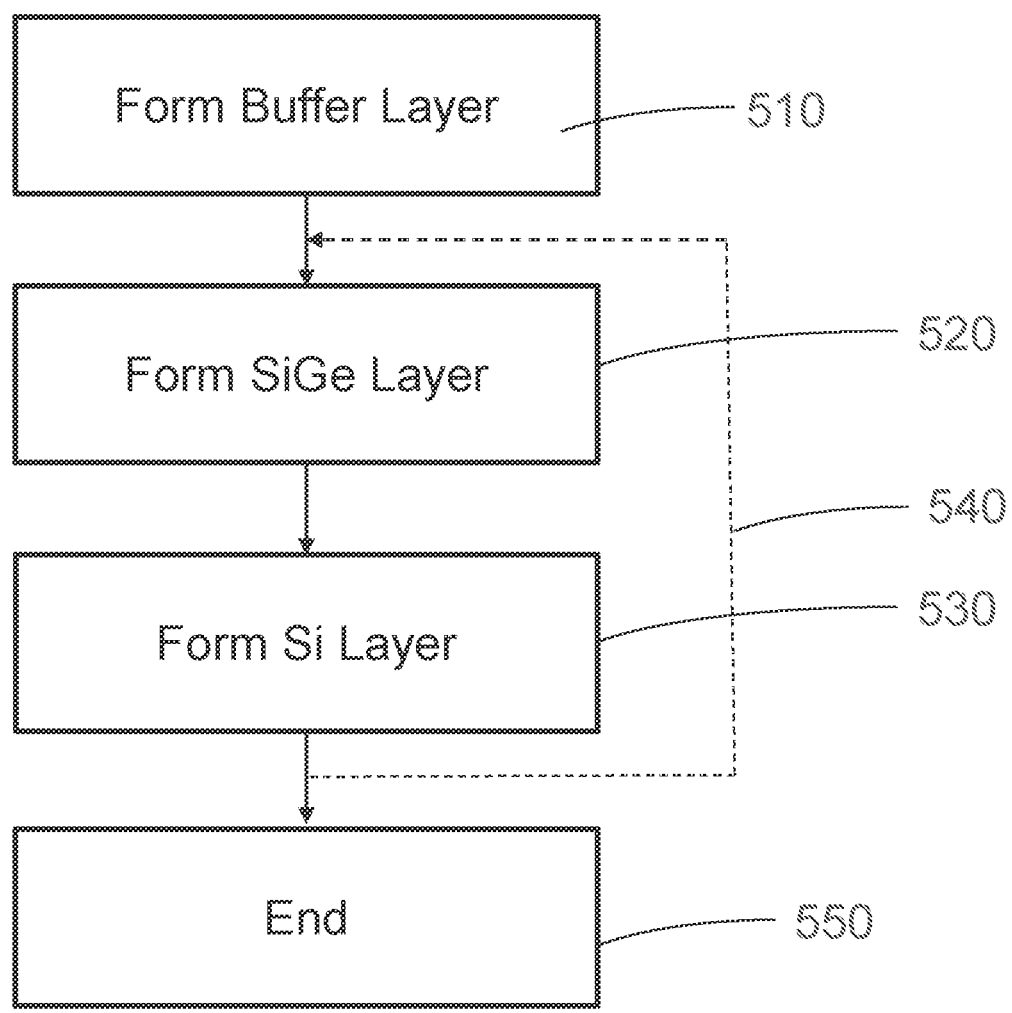
FIG. 5 shows a process flow of an exemplary embodiment of a method as described herein.

FIG. 5 shows a process flow of an exemplary embodiment of a method as described herein. The method comprises a step (510) of epitaxially forming a buffer layer. Then, the method comprises a step (520) of epitaxially forming a SiGe layer. Then, the method comprises a step (530) of epitaxially forming a Si layer. Optionally, the steps (520,530) of epitaxially forming the SiGe and the Si layers can be repeated (540) one or more times. After a Si—SiGe superlattice comprising one or more SiGe—Si bilayers has been formed, the method ends (550). It shall be understood that in advantageous embodiments, all of the steps (510-540) of epitaxially forming a buffer layer, epitaxially forming a SiGe layer, epitaxially forming a Si layer, and repeating the SiGe layer and Si layer formation steps, can be carried out without intervening vacuum break. In other words, all these steps are advantageously carried out one after the other in a single vacuum chamber, in one process containing these steps. Doing so can advantageously improve the quality of the resulting epitaxial layers.

The example embodiments of the disclosure described above do not limit the scope of the invention, since these embodiments are merely examples of the embodiments of the disclosure; the invention is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method, comprising:
 providing a substrate to a reaction chamber, the substrate comprising a monocrystalline Si(110) substrate having a monocrystalline silicon Si(110) surface;
 cleaning the substrate by exposing the substrate to fluorine radicals and baking the substrate in $H_2$-containing gas at a temperature within a range of 800° C. to 1000° C.;
 exposing the substrate to dichlorosilane gas at a flow rate within a range of 50 sccm to 300 sccm, thereby epitaxially forming a monocrystalline silicon buffer layer on the monocrystalline silicon Si(110) surface; and
 executing two or more deposition cycles to form two or more bilayers overlying the monocrystalline silicon buffer layer, each bilayer of the two or more bilayers comprising a SiGe layer and a Si layer, wherein the step of executing the two or more deposition cycles includes:
 (A) executing a first deposition cycle comprising, in the order given:
  a first SiGe pulse including introducing dichlorosilane as a silicon precursor and germane as a germanium precursor into the reaction chamber, and
  a first Si pulse including introducing a mixture of dichlorosilane and silane as silicon precursors into the reaction chamber; and
 (B) executing a second deposition cycle comprising, in the order given:
  a second SiGe pulse including introducing dichlorosilane as a silicon precursor and germane as a germanium precursor into the reaction chamber, and
  a second Si pulse including introducing a mixture of dichlorosilane and silane as silicon precursors into the reaction chamber.

2. The method according to claim 1, wherein the step of exposing the substrate to dichlorosilane gas to form the monocrystalline silicon buffer layer and the step of executing the two or more deposition cycles are executed without any intervening vacuum break.

3. The method according to claim 1, wherein the flow rate in the step of exposing the substrate to dichlorosilane gas to form the monocrystalline silicon buffer layer is within a range of 100 sccm to 200 sccm.

4. The method according to claim 1, wherein the dichlorosilane gas in the step of exposing the substrate to dichlorosilane gas to form the monocrystalline silicon buffer layer is included with a carrier gas.

5. The method according to claim 1, wherein the dichlorosilane gas in the step of exposing the substrate to dichlorosilane gas to form the monocrystalline silicon buffer layer is included with an $H_2$ carrier gas.

6. A method, comprising:
 providing a substrate comprising a monocrystalline Si(110) substrate having a monocrystalline silicon Si(110) surface;
 cleaning the substrate by exposing the substrate to fluorine radicals and baking the substrate in $H_2$-containing gas;
 exposing the substrate to dichlorosilane gas to thereby epitaxially form a monocrystalline silicon buffer layer on the monocrystalline silicon Si(110) surface; and
 executing two or more deposition cycles to form two or more bilayers overlying the monocrystalline silicon buffer layer, each bilayer of the two or more bilayers comprising a SiGe layer and a Si layer, wherein the step of executing the two or more deposition cycles includes:
 (A) executing a first deposition cycle comprising, in the order given:
  a first SiGe pulse including introducing dichlorosilane as a silicon precursor and germane as a germanium precursor into a reaction chamber, and
  a first Si pulse including introducing a mixture of dichlorosilane and silane as silicon precursors into the reaction chamber; and (B) executing a second deposition cycle comprising, in the order given:
a second SiGe pulse including introducing dichlorosilane as a silicon precursor and germane as a germanium precursor into the reaction chamber, and
a second Si pulse including introducing a mixture of dichlorosilane and silane as silicon precursors into the reaction chamber.

7. The method according to claim 6, wherein the step of exposing the substrate to dichlorosilane gas to form the monocrystalline silicon buffer layer and the step of executing the two or more deposition cycles are executed without any intervening vacuum break.

8. The method according to claim 6, wherein the step of exposing the substrate to dichlorosilane gas to form the monocrystalline silicon buffer layer and the step of executing the two or more deposition cycles are executed in a single reaction chamber without any intervening vacuum break.

9. The method according to claim 6, wherein the step of baking the substrate in $H_2$-containing gas includes baking at a temperature within a range of 800° C. to 1000° C.

10. The method according to claim 6, wherein the step of exposing the substrate to dichlorosilane gas to form the monocrystalline silicon buffer layer comprises providing the dichlorosilane gas at a flow rate within a range of 50 sccm to 300 sccm.

11. The method according to claim 10, wherein the flow rate is within a range of 100 sccm to 200 sccm.

12. The method according to claim 6, wherein the dichlorosilane gas in the step of exposing the substrate to dichlorosilane gas to form the monocrystalline silicon buffer layer is included with a carrier gas.

13. The method according to claim 6, wherein the dichlorosilane gas in the step of exposing the substrate to dichlorosilane gas to form the monocrystalline silicon buffer layer is included with an $H_2$ carrier gas.

14. A method, comprising:
providing a substrate to a reaction chamber, the substrate comprising a monocrystalline Si(110) substrate having a monocrystalline silicon Si(110) surface;
cleaning the substrate by exposing the substrate to fluorine radicals and baking the substrate in $H_2$-containing gas at a temperature within a range of 800° C. to 1000° C.;
exposing the substrate to chlorosilane gas, thereby epitaxially forming a monocrystalline silicon buffer layer on the monocrystalline silicon Si(110) surface, wherein the chlorosilane gas is a member selected from the group of: tetrachlorosilane, trichlorosilane, dichlorosilane, monochlorosilane, chloropentamethyldisilane, dichlorotetramethyldisilane, hexachlorodisilane, pentachlorodisilane, or octachlorotrisilane; and
executing two or more deposition cycles to form two or more bilayers overlying the monocrystalline silicon buffer layer, each bilayer of the two or more bilayers comprising a SiGe layer and a Si layer, wherein the step of executing the two or more deposition cycles includes:

(A) executing a first deposition cycle comprising, in the order given:
a first SiGe pulse including introducing a chlorosilane as a silicon precursor and a germane as a germanium precursor into the reaction chamber, wherein the chlorosilane is a member selected from the group of: tetrachlorosilane, trichlorosilane, dichlorosilane, monochlorosilane, chloropentamethyldisilane, dichlorotetramethyldisilane, hexachlorodisilane, pentachlorodisilane, or octachlorotrisilane, and wherein the germane is a member selected from the group of: monogermane, digermane, trigermane, or tetragermane, and
a first Si pulse including introducing a mixture of dichlorosilane and silane as silicon precursors into the reaction chamber; and (B) executing a second deposition cycle comprising, in the order given:
a second SiGe pulse including introducing a chlorosilane as a silicon precursor and a germane as a germanium precursor into the reaction chamber, wherein the chlorosilane is a member selected from the group of: tetrachlorosilane, trichlorosilane, dichlorosilane, monochlorosilane, chloropentamethyldisilane, dichlorotetramethyldisilane, hexachlorodisilane, pentachlorodisilane, or octachlorotrisilane, and wherein the germane is a member selected from the group of: monogermane, digermane, trigermane, or tetragermane, and
a second Si pulse including introducing a mixture of dichlorosilane and silane as silicon precursors into the reaction chamber.

15. The method according to claim 14, wherein the step of exposing the substrate to chlorosilane gas to form the monocrystalline silicon buffer layer and the step of executing the two or more deposition cycles are executed without any intervening vacuum break.

* * * * *